United States Patent
Havens et al.

(10) Patent No.: US 10,156,620 B2
(45) Date of Patent: Dec. 18, 2018

(54) MULTIFUNCTIONAL SUPERCONDUCTING COIL PROVIDING ELECTROMAGNETIC INTERFERENCE SHIELDING AND SHIMMING FOR MAGNETIC RESONANCE IMAGING SYSTEM

(71) Applicant: GE MEDICAL SYSTEMS GLOBAL TECHNOLOGYCOMAPNY, LLC, Waukesha, WI (US)

(72) Inventors: Timothy John Havens, Florence, SC (US); Weijun Shen, Florence, SC (US); Zhenyu Zhang, Florence, SC (US)

(73) Assignee: GE MEDICAL SYSTEMS GLOBAL TECHNOLOGY COMPANY, LLC, Waukesha, WI (US)

( * ) Notice: Subject to any disclaimer, the term of this patent is extended or adjusted under 35 U.S.C. 154(b) by 212 days.

(21) Appl. No.: 15/107,037

(22) PCT Filed: Dec. 17, 2014

(86) PCT No.: PCT/US2014/070834
§ 371 (c)(1),
(2) Date: Jun. 21, 2016

(87) PCT Pub. No.: WO2015/100103
PCT Pub. Date: Jul. 2, 2015

(65) Prior Publication Data
US 2016/0341805 A1    Nov. 24, 2016

(30) Foreign Application Priority Data
Dec. 23, 2013 (CN) .......................... 2013 1 0717957

(51) Int. Cl.
*G01V 3/00* (2006.01)
*G01R 33/421* (2006.01)
(Continued)

(52) U.S. Cl.
CPC ....... *G01R 33/4215* (2013.01); *G01R 33/385* (2013.01); *G01R 33/3815* (2013.01);
(Continued)

(58) Field of Classification Search
CPC .................................................. G01R 33/4215
(Continued)

(56) References Cited

U.S. PATENT DOCUMENTS 6,265,960 B1   7/2001   Schauwecker
6,307,370 B1   10/2001  Schauwecker
(Continued)

OTHER PUBLICATIONS

International Search Report and Written Opinion for International Application No. PCT/US14/070834, dated Mar. 18, 2015, 12 pages.

*Primary Examiner* — Louis Arana

(57) ABSTRACT

The present invention relates to a magnetic field adjustment system for use in a magnetic resonance imaging (MRI) system and a respective method. The magnetic field adjustment system comprises a first magnetic field generating assembly and an additional assembly. Wherein the first magnetic field generating assembly is used for generating a first magnetic field required by the MRI; and the additional assembly, including a switch and a current branch line, is used for cooperating with the first magnetic field generating assembly to generate a second magnetic field required by the MRI.

12 Claims, 2 Drawing Sheets

(51) Int. Cl.
*G01R 33/3815* (2006.01)
*G01R 33/3875* (2006.01)
*G01R 33/385* (2006.01)
*H01F 6/06* (2006.01)

(52) U.S. Cl.
CPC ....... *G01R 33/3875* (2013.01); *G01R 33/421* (2013.01); *H01F 6/06* (2013.01)

(58) Field of Classification Search
USPC .......................................... 324/319, 320, 318
See application file for complete search history.

(56) References Cited

U.S. PATENT DOCUMENTS

| | | | |
|---|---|---|---|
| 6,456,076 B1* | 9/2002 | Joseph | G01R 33/4215 324/309 |
| 7,098,663 B1 | 8/2006 | Hollis | |
| 9,842,689 B2* | 12/2017 | Bindseil | H01F 41/04 |
| 2006/0061361 A1 | 3/2006 | Westphal | |
| 2007/0114997 A1 | 5/2007 | Hollis | |
| 2017/0067975 A1* | 3/2017 | Harris | G01R 33/3664 |

* cited by examiner

MULTIFUNCTIONAL SUPERCONDUCTING COIL PROVIDING ELECTROMAGNETIC INTERFERENCE SHIELDING AND SHIMMING FOR MAGNETIC RESONANCE IMAGING SYSTEM

CROSS-REFERENCE TO RELATED APPLICATIONS

This is a national stage application under 35 U.S.C. § 371(c) of PCT Application No. PCT/US14/070834, filed on Dec. 17, 2014, which claims priority to Chinese Application No. 201310717957.3, filed on Dec. 23, 2013, the disclosures of which are incorporated herein by reference in their entireties.

The present invention relates to the technical field of magnetic resonance imaging (MRI), and particularly to a magnetic field adjustment system useful for a MRI magnet assembly.

BACKGROUND

A superconducting magnet in MRI (Magnetic Resonance Imaging) adopts groups of superconducting coils to carry out different functions. For example, a group of superconducting coils, usually referred to as primary coils, are used for generating a static and spatially uniform magnetic field (B0 field). A group of superconducting coils, usually referred to as shim coils, meet strict requirements for field uniformity by generating specific field harmonics. A group of superconducting coils, usually referred to as EMI (Electro Magnetic Interference) shielding coils or B0 coils, are used for protecting the magnetic field against low-frequency EMI (such as a moving lift or car nearby).

It is to be noted that the above-mentioned coils all independently carry out the functions respectively set thereby, and each coil group carries out only one function. Therefore, such independent assemblies as switches and joints are required for each of the coil groups, and need to occupy space in the superconducting magnet.

If no shim coils are used, a large number of passive shims are usually required to meet requirements for uniformity, which leads to such difficulties as high insertion force (needs a special tool), high B0 drift (needs long-period calibration for compensation), and costly shimming processes particularly in the 3T system (including both labor and materials).

SUMMARY

An embodiment of the present invention provides a magnetic field adjustment system for use in a MRI magnetic field generating assembly. The magnetic field adjustment system comprises a first magnetic field generating assembly and an additional assembly. Wherein the first magnetic field generating assembly is used for generating a first magnetic field required by the MRI; and the additional assembly, including a switch and a current branch line, is useful for cooperating with the first magnetic field generating assembly to generate a second magnetic field required by the MRI.

Another embodiment of the present invention provides a magnetic field adjustment method for use in a MRI magnetic field generating assembly. The magnetic field adjustment method comprises: arranging a first magnetic field generating assembly so as to generate a first magnetic field required by the MRI; and arranging an additional assembly including a switch and a current branch line so as to cooperate with the first magnetic field generating assembly to generate a second magnetic field required by the MRI.

BRIEF DESCRIPTION OF THE DRAWINGS

In order to understand the present disclosure thoroughly, embodiments of the present invention will be described in detail hereinafter with reference to the following accompanying drawings, wherein.

DETAILED DESCRIPTION

Hereinafter, specific embodiments for carrying out the present invention will be described in detail with reference to the drawings. However, it should be appreciated that the present invention is not limited to the following specific embodiments.

Figure 1:
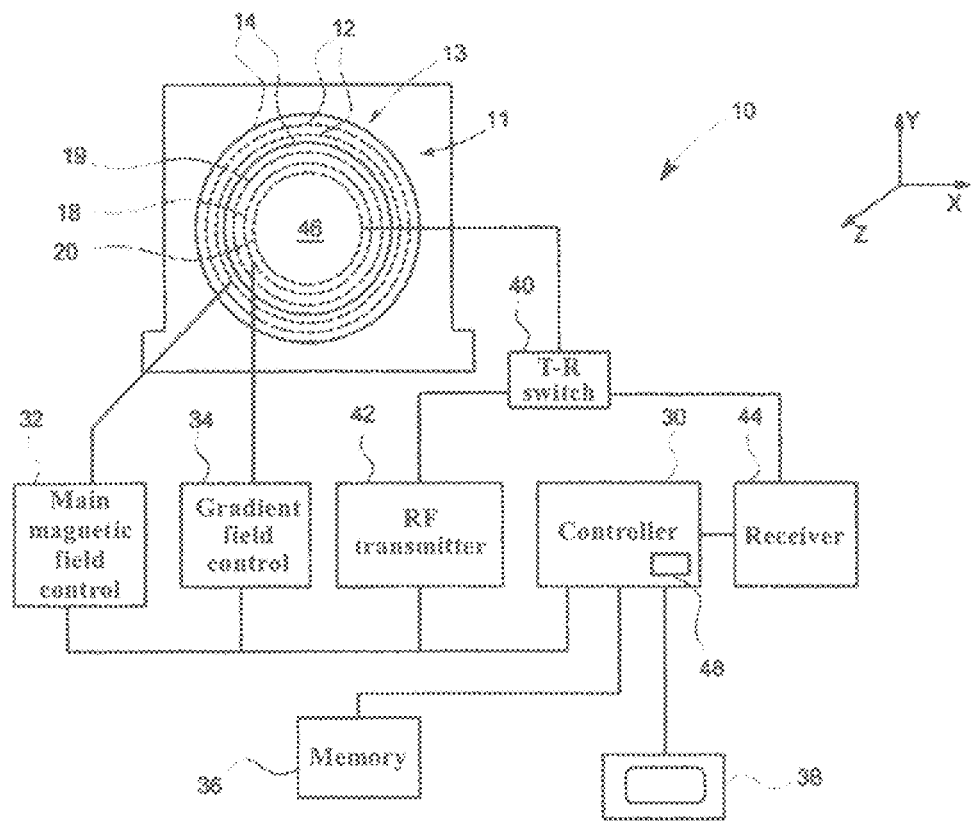
FIG. 1 is a schematic block diagram of an exemplary imaging system formed according to various embodiments.

Various embodiments of the magnetic field adjustment system described herein can be provided as part of medical imaging systems, such as an imaging system 10 shown in FIG. 1, or provided to be used together therewith. It should be appreciated that, although the imaging system 10 is illustrated as a single-modality imaging system, various embodiments can be realized in a multi-modality imaging system or using a multi-modality imaging system. For example, the imaging system 10 is illustrated as a MRI imaging system, and can be combined with different types of medical imaging systems, such as computer tomography (CT), positron emission tomography (PET), single photon emission computed tomography (SPECT) and ultrasonic system, or any other system capable of generating images (particularly of human) and the like. Furthermore, various embodiments are not limited to medical imaging systems for imaging of subjects, and may include veterinary or non-medical systems for imaging of non-human objects, luggage and the like.

In an exemplary embodiment, the imaging system 10 comprises a superconducting magnet assembly 11 including a superconducting magnet 12. The superconducting magnet 12, formed by a plurality of magnetic coils supported by a magnet coil support structure, includes a primary coil, an EMI shielding coil, a shim coil and the like. In one embodiment, the superconducting magnet assembly 11 may further include a thermal shield 13. A helium vessel 14 encircled by an outer vacuum vessel, which is encircled by the thermal shield 13. The helium vessel 14, the thermal shield 13 and the outer vacuum vessel 15 as described above together to form a cryostat 17. In operation, the vessel 14 is filled with liquid helium to cool coils of the magnet 12. In space between the liquid helium vessel 14 and the outer vacuum vessel can be provided thermal insulation (not shown). The imaging system 10 further includes a primary gradient coil 18, a shielding gradient coil 19 and a RF transmission coil 20. Typically, the imaging system 10 further includes a controller 30, a primary magnetic field control 32, a gradient field control 34, a memory 36, a display device 38, a transmit-receive (T-R) switch 40, a RF transmitter 42 and a receiver 44.

In operation, the body of an object, for example, a patient (not shown), a human phantom or the like to be imaged is placed on a suitable support, for example, an electric table (not shown) or other patient-specific table and disposed in a bore 46. The superconducting magnet 12 generates a uniform and static primary magnetic field B across the bore 46. The controller 30 controls intensity of the electromagnetic field in the bore 46 and correspondingly in the patient via the primary magnetic field control 32. The primary magnetic field control 32 further controls supply of exciting current to the superconducting magnet 12.

The primary gradient coil 18 which can include one or more gradient coil elements is provided such that magnetic gradient can be applied to the magnetic field B0 in the bore 46 in any one or more of three orthogonal directions x, y and z. The primary gradient coil 18 is excited by the gradient field control 34 and also controlled by the controller 30.

The shielding gradient coil 13 create a field, which counteracts a field generated by the primary gradient coil 18 in an outer region of the shielding coil 13, thereby reducing any mutual inductance with such conductive members as thermal shield and reducing composite eddy current.

The RF transmission coil 20 which can include a plurality of coils (for example, resonance surface coils) is provided to send a magnetic pulse, and/or if an accommodating coil element is further provided, it is applicable to optionally detect a MR signal from the patient at the same time. The RF transmission coil 20 and a receiving surface coil (if provided) may optionally be interconnected to one of the RF transmitter 42 and the receiver 44 via the T-R switch 40, respectively. The RF transmitter 42 and the T-R switch 40 are controlled by the controller 30, such that a RF field pulse or signal is generated by the RF transmitter 42 and is selectively applied to the patient for exciting magnetic resonance in the patient.

After the RF pulse is applied, the T-R switch 40 is actuated again to decouple the RF transmission coil 20 from the RF transmitter 42. The detected MR signal is thus transmitted to the controller 30. The controller 30 includes a processor 48 which controls processing of the MR signal to produce a signal representing an image of the patient. The processed signal representing the image is further sent to the display device 38 to provide a visual display of the image. To be specific, the MR signals filling or forming K space are Fourier transformed to obtain a visible image; and then the processed signal representing the image is sent to the display device 38.

Figure 2:
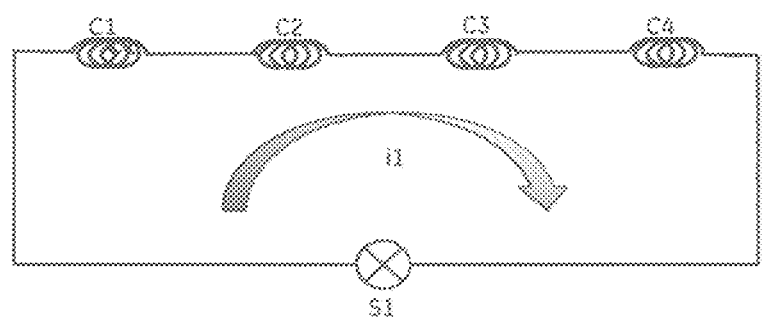
FIG. 2 is a schematic diagram illustrating an EMI shielding coil according to the prior art.

FIG. 2 is a schematic diagram illustrating an EMI shielding coil according to the prior art. B0 coil, which belongs to part of a superconducting magnet 12, is typically realized by a small superconducting coil carrying only relatively small current (<50 A). The B0 coil comprises four sub-coils C1, C2, C3 and C4 winding at different positions within the magnet. The four sub-coils are connected in series to form a closed loop having a switch S1. The positions and geometries of these sub-coils are carefully selected to achieve a particular mutual coupling. When EMI occurs, appropriate current (in a clockwise direction as shown in FIG. 2) will be induced in the B0 coil, so that the primary field in the Field of View (FOV) only is subjected to less than 3% of the original EMI interference, which is acceptable for imaging use in the current MRI industry.

Figure 3:
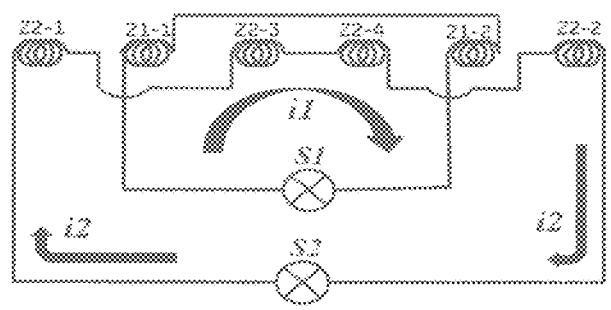
FIG. 3 is a schematic diagram illustrating a shim coil according to the prior art.

FIG. 3 is a schematic diagram illustrating a shim coil according to the prior art. The shim coil, which belongs to part of a superconducting magnet 12, includes two spatially intersecting closed loops. Therein, one loop, loop Z1 includes coils Z1-1 and Z1-2, and a switch S1; and the other loop, loop Z2 includes coils Z2-1, Z2-2, Z2-3 and Z2-4, and a switch S2. Current of the two loops can be controlled separately via the switches S1 and S2. As shown, current directions in the loops Z1 and Z2 are both clockwise. In the loop Z1, the current directions in the coils Z1-1 and Z1-2 are opposite (i.e., seen from a same axial direction, one of the current directions in the coils Z1-1 and Z1-2 is clockwise, and the other is anticlockwise). In the loop Z2, the current directions in the coils Z1-1, Z2-2, Z2-3 and Z2-4 are the same direction (i.e., seen from a same axial direction, the current directions in the coils Z1-1, Z1-2, Z1-3 and Z1-4 are all clockwise or anticlockwise).

Figure 4:
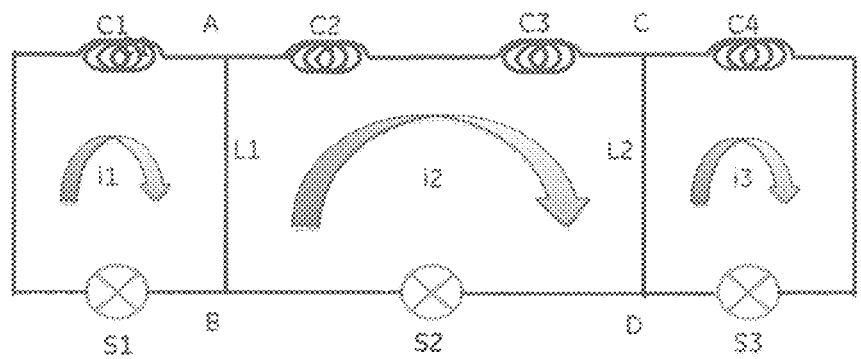
FIG. 4 is a schematic diagram illustrating an EMI shielding coil according to an embodiment of the present invention.

FIG. 4 is a schematic diagram illustrating an EMI shielding coil according to an embodiment of the present invention. Instead of using a conventional EMI shielding coil in which four sub-coils form a closed current loop, Inventors of the present invention introduce new branches with switches to the conventional EMI shielding coil circuit as shown in FIG. 1 so as to form three local current loops as shown in FIG. 4. The EMI shielding coil comprises a first sub-coil C1, a second sub-coil C2, a third sub-coil C3 and a fourth sub-coil C4 connected by turns in series; a first switch S1, a second switch S2 and a third switch S3; and further comprises a first connection branch line L1 and a second connection branch line L2. One end A of the first connection branch line L1 is connected to one pole of each of the first sub-coil C1 and second sub-coil C2, and the other end B is connected to one pole of each of the switches S1 and S2. One end C of the second connection branch line L2 is connected to one pole of each of the third sub-coil C3 and fourth sub-coil C4 and the other end D is connected to one pole of each of the switch S2 and switch S3. The first connection branch line L1 and the first sub-coil C1 form a first current loop i1; the second sub-coil C2, the third sub-coil C3, the first connection branch line L1 and the second connection branch line L2 form a second current loop i2; and the fourth sub-coil C4 and the second connection branch line L2 form a third current loop i3. Therein, the first switch S1 controls current in the first current loop i1; the second switch controls current in the second current loop i2; and the third switch controls current in the third current loop i3.

Through the above arrangement, firstly, it is evident that, EMI shielding capacity is still retained. It is because that EMI induced current is of purely inductive, which is determined by properties of the superconducting coil, and as long as mutual coupling is arranged properly, the shielding effect is achievable; next, by way of the newly introduced connection branch lines and switches, currents in the three current loops i1, i2 and i3 can be adjusted independently. For example, if the currents in i1 and i3 are identical in magnitude but opposite in direction, the currents can generate a linear field (odd harmonics) along Z axis (the Z-axis direction as shown in FIG. 1, i.e., the longitudinal direction of the human body in the bore, which is also the primary magnetic field direction). Meanwhile, the current in i2 can be used to generate a secondary field along the Z axis (even harmonics). In short, in order to perform the EMI shielding function, all the coils cooperate to provide shielding effect; and in order to perform the shimming function, each coil operates independently to process axial even or odd harmonics.

As seen from above, the usage of an EMI shielding coil according to one embodiment of the present invention can not only retain the EMI shielding function, but also serve as a shim correction coil to compensate for the axial even harmonics and odd harmonics. Theoretical analysis has shown that, as compared with an independent correction coil, the above dual functions can be achieved at an extremely low cost in a design of the EMI shielding coil according to the present invention. Although shimming capacity realized by the present EMI shielding coil is not necessarily as powerful as the independent correction coil, it has a great advantage in some completely passive shimming systems, capable of helping reduce the number of passive shims and thereby simplifying costly shimming processes.

In the present disclosure, the term "a" or "an" are used to identify singular or plural (more than one) aspects of an object, respectively. The term "or" is used to refer to a nonexclusive or, unless specified otherwise. The terms "first", "second", "third" and the like are used merely as tags, and are not intended to set quantity or sequence requirements for the object concerned.

Although several embodiments are described and illustrated herein, those of ordinary skill in the art should readily think of various other devices and/or structures for performing the functions and/or obtaining the results and/or one or more of the advantages, and should appreciate that each of such changes and/or modifications is considered to fall within the scope of the embodiments of the present disclosure. Persons skilled in the art should recognize, or can determine only via routine examination many equivalents of the specific embodiments described herein. Therefore, it should be understood that the foregoing embodiments are presented only by way of examples, and within the scope of the appended claims and the equivalents concerned, disclosed embodiments can be further practiced in addition to the specific description and requirement. The embodiments of the present disclosure are directed to each individual feature, system, article, material, kit, and/or method described herein. Moreover, any combination of two or more of such features, systems, articles, materials, kits, and/or methods, if such features, systems, articles, materials, kits, and/or methods are not inconsistent with one another, is then included within the scope of the present disclosure.

It should be further understood that, unless expressly specified to be the contrary, in any method comprising more than one step or action as required herein, sequence of the steps or actions of the method is not limited to the listed sequence of the steps or actions of the method.

In the claims and in the description above, all such transitional expression as "form" "include," "carry" "have" "comprise" "involve/concern", "hold" and "composite" should be construed as open-ended, i.e., mean including but not limiting. Only the transitional expressions "consisting of" and "mainly consisting of" should be construed as a closed or semi-closed transitional expression, respectively.

What we claim is:

1. A superconducting magnet system for use in a magnetic resonance imaging system, the superconducting magnet system comprising:
    a primary coil assembly configured to generate a static and spatially uniform magnetic field; and
    an additional coil assembly configured to operate in either a first mode or a second mode, wherein the additional coil assembly provides electro magnetic interference (EMI) shielding for the primary coil assembly in the first mode, and provides shimming for the primary coil assembly in the second mode.

2. The superconducting magnet system according to claim 1, wherein the additional coil assembly comprises:
    a first sub-coil, a second sub-coil, a third sub-coil, and a fourth sub-coil connected in series;
    a first switch, a second switch, and a third switch connected in series;
    a first connection branch line, one end between the first and second sub-coils, and the other end between the first switch and the second switch; and
    a second connection branch line, one end between the third and fourth sub-coils, and the other end between the second switch and the third switch,
    wherein the first sub-coil and the first switch form a first current loop, the second and third sub-coils and the second switch form a second current loop, and the fourth sub-coil and the third switch form a third current loop.

3. The superconducting magnet system according to claim 2, wherein in the first mode, the first, second, and third current loops collectively provide the EMI shielding.

4. The superconducting magnet system according to claim 2, wherein in the second mode, the first current loop and the third current loop provide odd harmonics.

5. The superconducting magnet system according to claim 4, wherein currents in the first and third current loops are identical in magnitude and opposite in direction.

6. The superconducting magnet system according to claim 2, wherein in the second mode, the second current loop provides even harmonics.

7. A method for generating magnetic field in a magnetic resonance imaging system, the method comprising:
    arranging a primary coil assembly to generate a static and spatially uniform magnetic field;
    arranging an additional coil assembly to provide electro magnetic interference (EMI) shielding for the primary coil assembly in a first mode; and
    arranging the additional assembly to provide shimming for the primary coil assembly in a second mode.

8. The method according to claim 7, wherein the additional coil assembly comprises:
    a first sub-coil, a second sub-coil, a third sub-coil, and a fourth sub-coil connected in series;
    a first switch, a second switch, and a third switch connected in series;
    a first connection branch line, one end between the first and second sub-coils, and the other end between the first switch and the second switch; and
    a second connection branch line, one end between the third and fourth sub-coils, and the other end between the second switch and the third switch,
    wherein the first sub-coil and the first switch form a first current loop, the second and third sub-coils and the second switch form a second current loop, and the fourth sub-coil and the third switch form a third current loop.

9. The method according to claim 8, wherein arranging the additional coil assembly to provide the EMI shielding in the first mode comprises arranging the first, second, and third current loops collectively to provide the EMI shielding.

10. The method according to claim 8, wherein arranging the additional coil assembly to provide shimming in the second mode comprises arranging the first current loop and the third current loop to provide odd harmonics.

11. The method according to claim 10, wherein currents in the first and third current loops are identical in magnitude and opposite in direction.

12. The method according to claim 8, wherein arranging the additional coil assembly to provide shimming in the second mode comprises arranging the second current loop to provide even harmonics.

* * * * *